(12) United States Patent
Mizusaki

(10) Patent No.: US 6,490,165 B2
(45) Date of Patent: Dec. 3, 2002

(54) DEFORMATION-RESISTANT MOUNTING STRUCTURE OF PORTABLE DEVICE

(75) Inventor: Manabu Mizusaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/987,325

(22) Filed: Nov. 14, 2001

(65) Prior Publication Data

US 2002/0057556 A1 May 16, 2002

(30) Foreign Application Priority Data

Nov. 14, 2000 (JP) ........................... 2000-347347

(51) Int. Cl.[7] .............................. H05K 7/14; H05K 5/02
(52) U.S. Cl. ...................... 361/752; 361/742; 361/749; 361/758; 361/736; 361/804
(58) Field of Search ................ 361/752, 749, 361/742, 748, 804, 758

(56) References Cited

U.S. PATENT DOCUMENTS

| 4,969,065 A | * | 11/1990 | Petri ........................... 361/412 |
| 5,452,184 A | * | 9/1995 | Scholder et al. ............ 361/799 |
| 5,894,408 A | | 4/1999 | Start et al. |
| 5,912,806 A | * | 6/1999 | Onoda et al. ................ 361/737 |
| 5,956,835 A | * | 9/1999 | Aksu ........................... 29/468 |
| 5,959,844 A | * | 9/1999 | Simon et al. ................ 361/759 |
| 6,259,032 B1 | | 7/2001 | Fernandez |
| 6,423,441 B1 | * | 7/2002 | Ronning et al. .............. 429/82 |

FOREIGN PATENT DOCUMENTS

| JP | 63-115251 | 7/1988 |
| JP | 64-18300 | 1/1989 |
| JP | 8-153982 | 6/1996 |
| JP | 09-181403 | 7/1997 |
| JP | 11-330640 | 11/1999 |

* cited by examiner

*Primary Examiner*—Randy W. Gibson
*Assistant Examiner*—Dameon E. Levi
(74) *Attorney, Agent, or Firm*—Young & Thompson

(57) ABSTRACT

Disclosed is a novel deformation-resistant structure of a portable device, capable of reducing an electric failure by decreasing a distortion which occurs in a soldered portion between a printed circuit board of the portable device and an electric part mounted on the board due to a mechanical stress such as drop or pressure. Through slits are formed in positions in a printed wiring plate, which correspond to bosses having prepared holes disposed at the corners of a casing. By inserting screws into the prepared holes through the through slits, the printed circuit board is mounted in the casing. Although the casing is deformed when an external mechanical stress is applied to the casing, the screw and the boss can slide along each of the through slits. Thus, a deformation amount of the printed circuit board is not caused or becomes smaller than that of the casing.

2 Claims, 5 Drawing Sheets

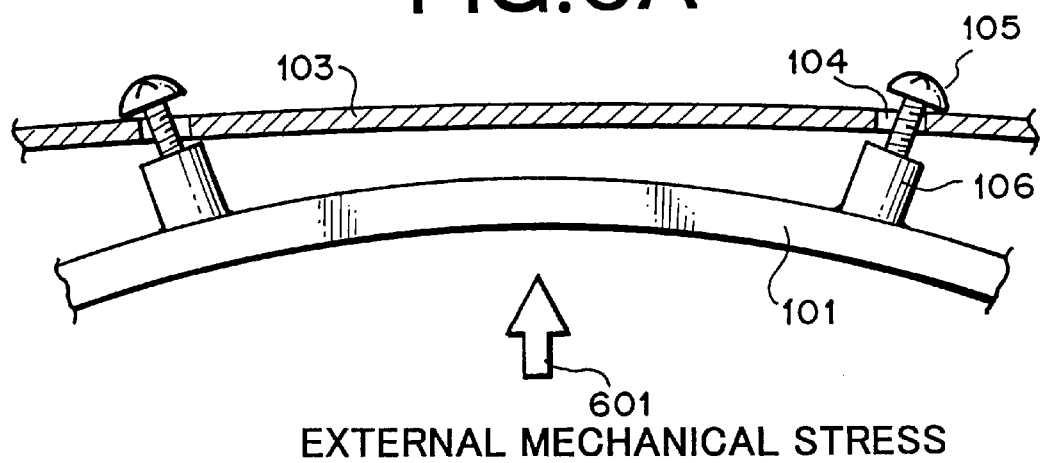
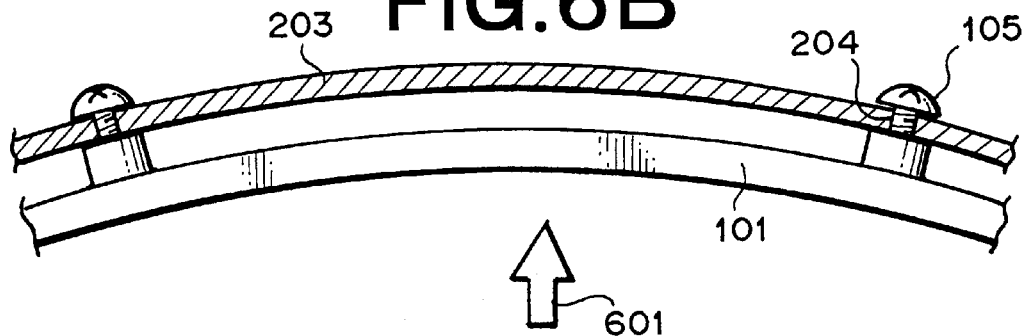
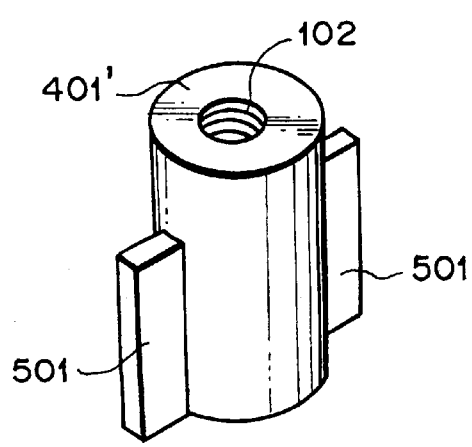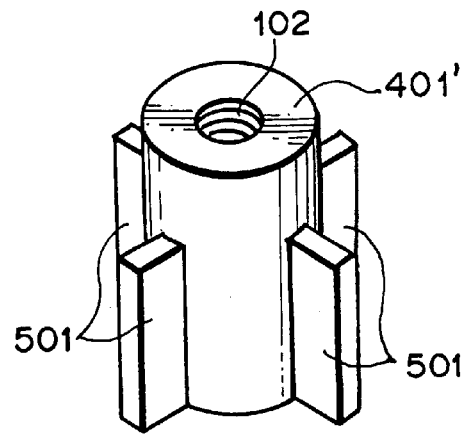

DEFORMATION-RESISTANT MOUNTING STRUCTURE OF PORTABLE DEVICE

BACKGROUND OF THE INVENTION

1. Field of the Invention

The present invention relates to a printed circuit board of a portable device such as portable telephone, PHS, or PDA and a structure of a casing in which the printed circuit board is mounted and, more particularly, to a deformation-resistant mounting structure of a portable device.

2. Description of the Prior Art

Since a portable device such as a portable telephone or PDA becomes lighter, thinner, and smaller, the user can easily carry it in his/her pocket or the like.

FIG. 1 is an exploded perspective view showing a general schematic structure of a conventional technique of this kind.

In FIG. 1, a plurality of screws 105 are inserted in through holes 204 of a printed circuit board 203 and screwed into prepared holes 102 of bosses 106 of a casing 101, thereby sandwiching the printed circuit board 203 of a portable device between the top surfaces of the bosses 106 and the screws 105 and mounting the printed circuit board 203 on the casing 101.

Due to light weight, thinness, and small size, the user sometimes forgets that he/she carries a portable device. Consequently, an electric failure is increasingly caused by a drop of the portable device from a breast pocket when the user stoops down or by pressure applied on the portable device in a pocket of pants when the user sits down.

By a mechanical stress such as drop or pressure, distortion occurs in a soldered portion between the printed circuit board of the portable device and an electric part mounted on the board.

Because of the distortion, disconnection occurs due to a crack in the soldered portion, and it causes an electric failure.

For solving the problem, in Japanese Unexamined Utility Model No. 63-115251 as a first conventional technique, a printed circuit board in which at least one slit or groove is formed so as to surround a portion sandwiched by holding members has been proposed.

Techniques similar to the first conventional technique are disclosed in Japanese Patent Application Laid-Open Nos. 64-18300, 9-181403, and 11-330640 as second, third, and fourth conventional techniques, respectively.

The first to fourth conventional techniques, however, have the following drawbacks.

Specifically, deformation in a printed circuit board cannot be prevented only by a plurality of slits or grooves formed around portions for fixing the printed circuit board to a casing, the mechanical stress of an external force cannot be sufficiently absorbed, and an effective area of the printed circuit board is reduced by the area of the portions in which the slits or grooves are formed.

SUMMARY OF THE INVENTION

In order to overcome the aforementioned disadvantages, the present invention has been made and accordingly, has an object to provide a novel deformation-resistant mounting structure of a portable device, capable of reducing an electric failure by decreasing the distortion, that is, capable of improving the mechanical strength of a portable device.

Another object of the present invention is to provide a novel portable information terminal device enabling convenience and reliability of a portable information terminal or the like to be improved.

According to a first aspect of the present invention, there is provided a deformation-resistant mounting structure of a portable device comprising: a printed circuit board in which a plurality of though holes are formed; a casing having a plurality of bosses each having a seat and a prepared hole or a threaded hole, the seat is provided for mounting the printed circuit board, a plurality of screws each being inserted into the prepared hole or the threaded hole of each of the plurality of bosses through each of the plurality of through holes, wherein each of the plurality of through holes is formed in a slit shape, and wherein when the casing is deformed, each of the plurality of screws displaces along a direction of the slit shape.

According to a second aspect of the present invention, there is provided a deformation-resistant mounting structure of a portable device comprising: a printed circuit board in which a plurality of though holes are formed; a chassis having a plurality of bosses each having a seat and a prepared hole or a threaded hole, the seat is provided for mounting the printed circuit board, a plurality of screws each being inserted into the prepared hole or the threaded hole of each of the plurality of bosses through each of the plurality of through holes, wherein each of the plurality of through holes is formed in a slit shape, and wherein when the chassis is deformed, each of the plurality of screws displaces along a direction of the slit shape.

According to a third aspect of the present invention, there is provided a deformation-resistant mounting structure of a portable device comprising: a printed circuit board in which a plurality of though holes are formed; a casing having a plurality of bosses each having a seat and a male screw, the seat is provided for mounting the printed circuit board, a plurality of screw nuts, into each of which each of the male screws is inserted through each of the plurality of through holes, wherein each of the plurality of through holes is formed in a slit shape, and wherein when the casing is deformed, each of the plurality of male screws displaces along a direction of the slit shape.

According to a fourth aspect of the present invention, there is provided a deformation-resistant mounting structure of a portable device comprising: a printed circuit board in which a plurality of though holes are formed; a chassis having a plurality of bosses each having a seat and a male screw, the seat is provided for mounting the printed circuit board, a plurality of screw nuts, into each of which each of the male screws is inserted through each of the plurality of through holes, wherein each of the plurality of through holes is formed in a slit shape, and wherein when the chassis is deformed, each of the plurality of male screws displaces along a direction of the slit shape.

According to a fifth aspect of the present invention, there is provided a deformation-resistant mounting structure of a portable device comprising: a printed circuit board in which a plurality of though holes are formed; a casing having a plurality of bosses each having a seat and a pillar on the seat, the seat is provided for mounting the printed circuit board, the pillar having a prepared hole or a threaded hole, the pillar being inserted into each of the through holes, a plurality of screws each being inserted into the prepared hole or the threaded hole of each of the pillars, wherein each of the plurality of through holes is formed in a slit shape, and wherein when the casing is deformed, each of the plurality of pillars displaces along a direction of the slit shape.

According to a sixth aspect of the present invention, there is provided a deformation-resistant mounting structure of a portable device comprising: a printed circuit board in which a plurality of though holes are formed; a chassis having a plurality of bosses each having a seat and a pillar on the seat, the seat is provided for mounting the printed circuit board, the pillar having a prepared hole or a threaded hole, the pillar being inserted into each of the through holes, a plurality of screws each being inserted into the prepared hole or the threaded hole of each of the pillars, wherein each of the plurality of through holes is formed in a slit shape, and wherein when the chassis is deformed, each of the plurality of pillars displaces along a direction of the slit shape.

According to a seventh aspect of the present invention, there is provided a deformation-resistant mounting structure of a portable device comprising: a printed circuit board in which a plurality of though holes are formed; a casing having a plurality of bosses each having a seat and a pillar on the seat, the seat is provided for mounting the printed circuit board, the pillar having a male screw, the pillar being inserted into each of the through holes, a plurality of screw nuts, into each of which each of the male screw is inserted, wherein each of the plurality of through holes is formed in a slit shape, and wherein when the casing is deformed, each of the plurality of pillars displaces along a direction of the slit shape.

According to a eighth aspect of the present invention, there is provided a deformation-resistant mounting structure of a portable device comprising: a printed circuit board in which a plurality of though holes are formed; a chassis having a plurality of bosses each having a seat and a pillar on the seat, the seat is provided for mounting the printed circuit board, the pillar having a male screw, the pillar being inserted into each of the through holes, a plurality of screw nuts, into each of which each of the male screw is inserted, wherein each of the plurality of through holes is formed in a slit shape, and wherein when the chassis is deformed, each of the plurality of pillars displaces along a direction of the slit shape.

BRIEF DESCRIPTION OF THE DRAWINGS

FIG. 6A is a diagram for explaining the operation of the first embodiment of the present invention;

FIG. 6B is a diagram showing the operation of a conventional technique;

FIGS. 7A and 7B are perspective views showing further embodiments of the present invention;

DETAILED DESCRIPTION OF THE PREFERRED EMBODIMENTS

Preferred embodiments of the present invention will now be described in detail hereinbelow with reference to the drawings.

[First Embodiment]

Figure 1:
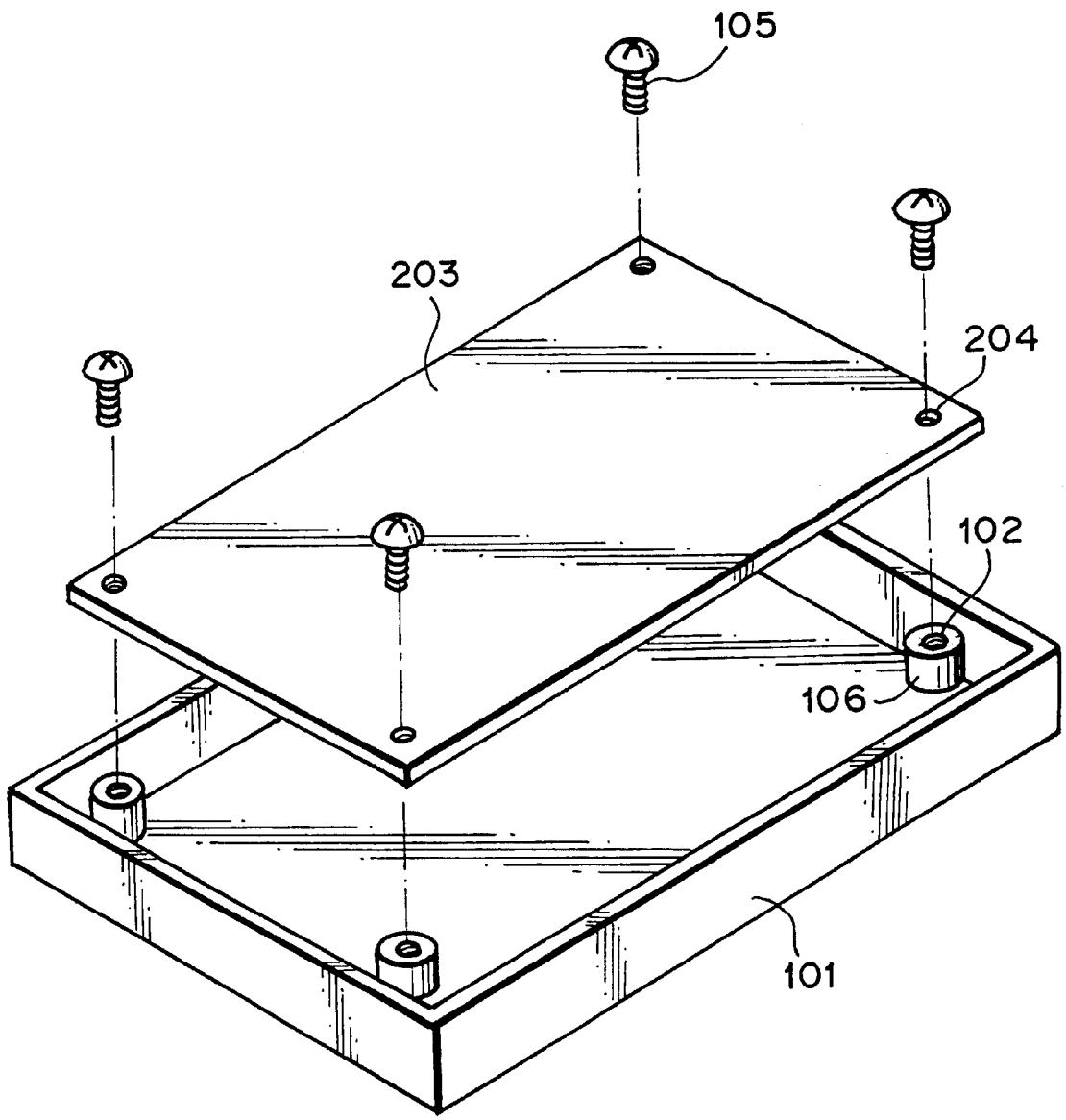
FIG. 1 is an exploded perspective view showing a conventional technique.
Figure 2:
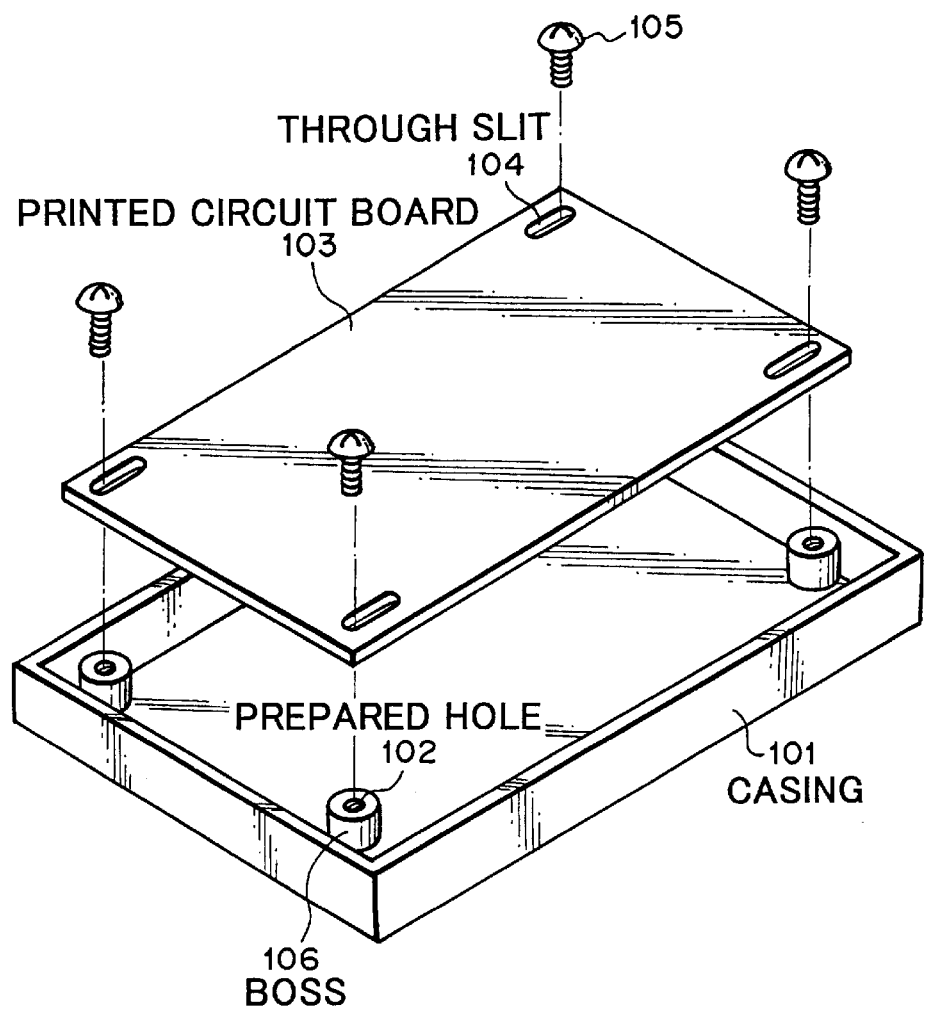
FIG. 2 is an exploded perspective view showing a first embodiment according to the present invention.
Figure 3:
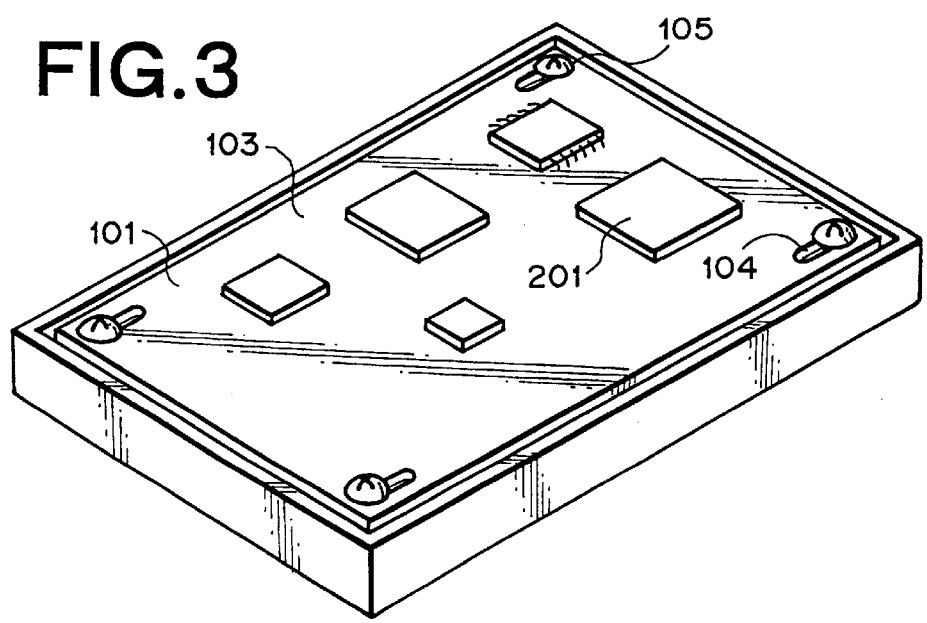
FIG. 3 is a perspective view showing the inside of the first embodiment according to the present invention in a state where a cover is removed.
Figure 4:
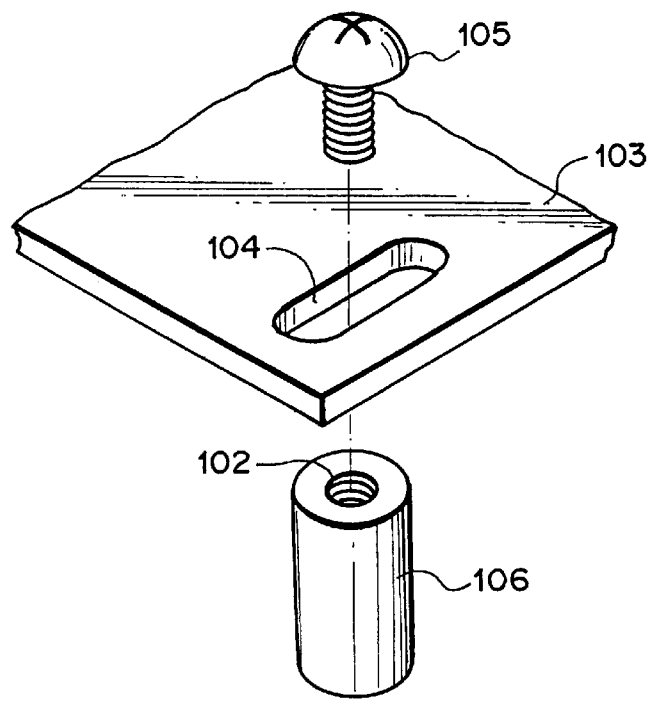
FIG. 4 is an exploded perspective view showing the main portion of the first embodiment according to the present invention.

Referring to FIGS. 2 to 4, bosses 106 in which prepared holes 102 are formed are provided at corners of a casing 101. Prepared holes 102 are prepared for screw-tapping. Prepared holes may be substituted by threaded holes.

In order to decrease application of an external mechanical stress onto a printed circuit board 103, holes through which screws 105 are inserted are formed as through slits 104 in the printed circuit board 103.

Specifically, in the printed circuit board 103, as described above, the through slits 104 are formed in positions corresponding to the bosses 106 in the casing 101 as shown in FIGS. 2 and 4. In the example of the first embodiment, the through slits 104 are formed in the longitudinal direction at four corners of the printed circuit board 103. However, the through slits 104 may be formed in the direction orthogonal to the longitudinal direction or in an arbitrary direction.

The printed circuit board 103 according to the present invention is mounted on the casing 101 as shown in FIG. 3, thereby realizing a structure that an external mechanical stress due to drop or pressure is not directly applied to the printed circuit board 103.

[Second Embodiment]

Figure 5A:
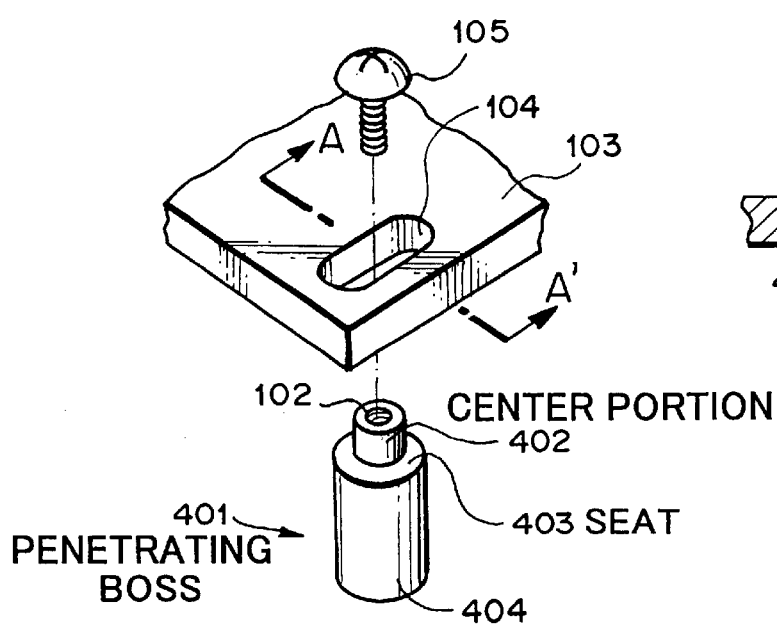
FIG. 5A is an exploded perspective view of the main portion of a second embodiment according to the present invention.
Figure 5B:
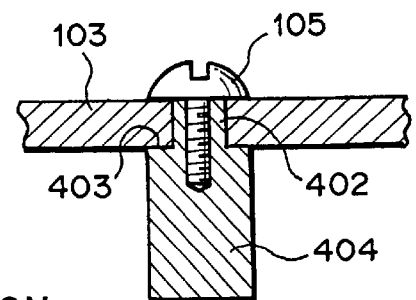
FIG. 5B is a cross section taken along line A–A' of FIG. 5A in the case where a printed circuit board is mounted on a casing.

In FIGS. 5A and 5B, in the second embodiment according to the present invention, in order to further decrease application of an external mechanical stress to the printed circuit board 103, a penetrating boss 401 consisting of a center portion 402, as a small diameter portion which penetrates the through slit 104 formed in the printed circuit board 103 and has a prepared hole 102, and a large diameter portion 404 having a seat 403 for mounting the printed circuit board 103 is employed, although the printed circuit board 103 is normally fixed between the boss 106 having the prepared hole 102 and the screw 105. It is desirable that the inside diameter of the through slit 104 is set slightly larger than the outside diameter of the center portion 402 so that the center portion 402 can be freely displaced in the through slit 104.

Further, from the viewpoint that the screw 105 and the center portion 402 are displaced smoothly in the through slit 104, it is preferable to polish the surfaces of the screw 105 and the center portion 402 contacting the printed circuit board so that the screw 105 and the center portion 402 slide easily.

By screwing the screw 105 into the prepared hole 102 in a state where the center portion 402 of the penetrating boss 401 of the casing 101 is inserted into the through slit 104 of the printed circuit board 103, the printed circuit board 103 is held between the bottom of the screw 105 and the top face of the seat 403 of the penetrating boss 401 in the casing 101.

The center portion 402 of the penetrating boss 401 is therefore interposed between the seat 403 and the printed circuit board 103. Therefore, by setting the height of the center portion 402 to be slightly larger than the thickness of the printed circuit board 103, even if the screw 105 is tightly screwed in the prepared hole 102, the printed circuit board 103 can be relatively freely moved in the casing 101.

[Operation of the First Embodiment]

The operation of the first embodiment according to the present invention will now be described.

FIG. 6A is a diagram for explaining the operation of the first embodiment according to the present invention. The operation of the present invention will be described while being compared with the conventional technique shown in FIG. 6B.

Conventionally, as shown in FIG. 6B, since the through hole 204 in the printed circuit board 203 has almost the same diameter as that of the screw 105, the printed circuit board 203 is firmly fixed to the casing 101. Consequently, when an external mechanical stress 601 is applied to the casing 101, the casing 101 is deformed. Since the printed circuit board 203 is firmly fixed to the casing 101, almost the same deformation occurs in the printed circuit board 103 on the inside.

In contrast, in the present invention, as shown in FIG. 6A, by using the through slit 104 in place of the through hole 204, even if an external mechanical stress 601 is applied to the casing 101, although the casing 101 is deformed, the screw 105 and the boss 106 can slide along the slit direction of the through slit 104. The deformation amount of the printed circuit board 103 is not caused or becomes smaller than that of the casing 101.

[Operation of Second Embodiment]

Further, in the second embodiment of the present invention, by providing the penetrating boss 401 having the center portion 402 in which the prepared hole is formed and which is inserted into the through slit 104 and the large diameter portion 404 having the seat 403 for the printed circuit board 103, the fixation between the printed circuit board 103 and the casing 101 becomes less firm. Consequently, the center portion 402 can easily slide in the longitudinal direction of the through slit 104. In such a manner, the deformation amount of the printed circuit board 103 is not caused or reduced.

[Further embodiment]

FIGS. 7A and 7B are perspective views showing further embodiments (modifications of the second embodiment) according to the present invention.

FIGS. 7A and 7B show a penetrating boss 401' having plate-shaped seats 501 obtained by changing the shape of the seat 403 of the penetrating boss 401 into a plate shape in order not to deteriorate the packing density on the printed circuit board 103. The number of the plate-shaped seats 501 is not limited. In FIG. 7A, two plate-shaped seats 501 are provided. In FIG. 7B, four plate-shaped seats 501 are formed.

Figure 8:
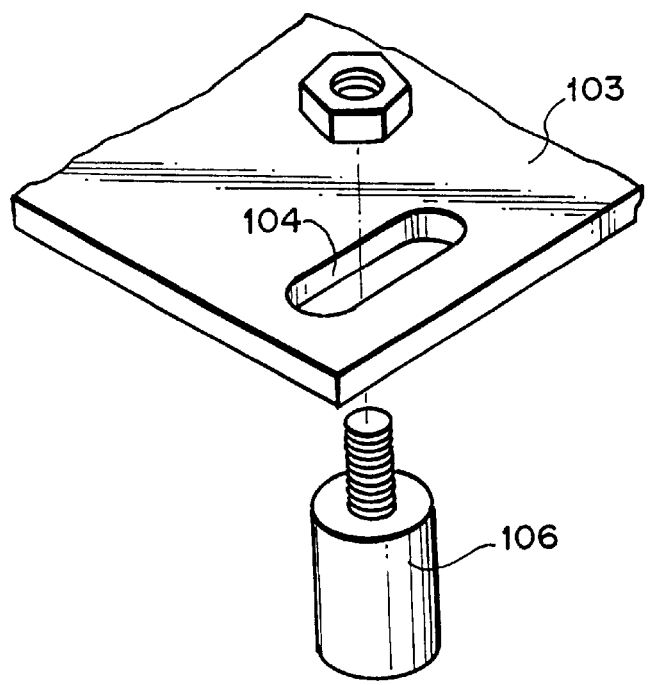
FIG. 8 is a perspective view showing still further embodiment of the present invention.
Figure 9:
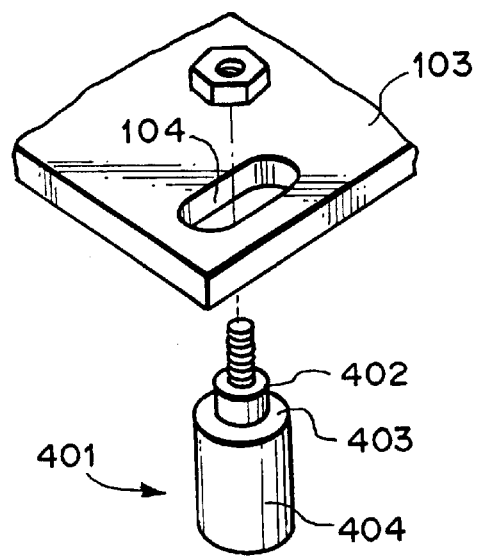
FIG. 9 is a perspective view showing still further embodiment of the present invention.

The combination of the screw 105 and a provided hole 102 or a a threaded hole may be substituted by a combination of a screw nut and a male screw formed on the boss 106 or 401 as shown in FIGS. 8 and 9.

The casing 101 may be substituted by a chassis having bosses 106 or 401.

1. As shown in FIGS. 7A and 7B, the seat 403 of the penetrating boss 401 is changed into the shape of the plate-shaped seats 501. With the configuration, an effect equal to that of the second embodiment can be obtained.

2. The distortion can be controlled by the direction of the through slit 104, so that an electric part or portion particularly sensitive to a distortion can be arbitrarily avoided.

The present invention is constructed and operates as described above. According to the present invention, effects as described hereinbelow can be obtained.

1. A mechanical stress on a printed circuit board can be reduced or eliminated and distortion in the soldered portion can be lessened.

2. An electric failure due to drop or the like can be decreased.

What is claimed is:

1. A deformation-resistant mounting structure of a portable device comprising:

a printed circuit board in which a plurality of though holes are formed;

a casing having a plurality of bosses each having a seat and a prepared hole or a threaded hole, said seat is provided for mounting said printed circuit board, a plurality of screws each being inserted into said prepared hole or said threaded hole of each of said plurality of bosses through each of said plurality of through holes, wherein each of said plurality of through holes is formed in a slit shape and wherein longitudinal axes of all of said slit shaped through holes are parallel to each other, and wherein when said casing is deformed, each of said plurality of screws displaces along a direction of said slit shape.

2. A deformation-resistant mounting structure of a portable device comprising:

a printed circuit board in which a plurality of though holes are formed;

a chassis having a plurality of bosses each having a seat and a prepared hole or a threaded hole, said seat is provided for mounting said printed circuit board, a plurality of screws each being inserted into said prepared hole or said threaded hole of each of said plurality of bosses through each of said plurality of through holes, wherein each of said plurality of through holes is formed in a slit shape and wherein longitudinal axes of all of said slit shaped through holes are parallel to each other, and wherein when said chassis is deformed, each of said plurality of screws displaces along a direction of said slit shape.

* * * * *